United States Patent
Wang et al.

[11] Patent Number: 5,963,816
[45] Date of Patent: Oct. 5, 1999

[54] METHOD FOR MAKING SHALLOW TRENCH MARKS

[75] Inventors: Larry Yu Wang, San Jose; Craig Sander, Mountain View; Anna Minvielle, San Jose, all of Calif.

[73] Assignee: Advanced Micro Devices, Inc., Sunnyvale, Calif.

[21] Appl. No.: 08/982,072

[22] Filed: Dec. 1, 1997

[51] Int. Cl.$^6$ .................................................. H01L 21/76
[52] U.S. Cl. .......................................... 438/401; 438/462
[58] Field of Search .................................. 438/401, 405, 438/412, 426, 432, 462; 257/797

[56] References Cited

U.S. PATENT DOCUMENTS 5,470,782  11/1995  Schwalke et al. ...................... 438/401

*Primary Examiner*—Charles Bowers
*Assistant Examiner*—Craig Thompson

[57] ABSTRACT

The separate formation of alignment marks and manufacturing a semiconductor device comprising photolithographically printing circuit patterns is avoided by utilizing trenches formed when etching to form shallow isolation trenches, thereby increasing manufacturing throughput and reducing costs. Embodiments include utilizing alignment trenches having a depth of about 2,400Å to less than about 4,000Å, e.g., 3,000Å, formed substantially simultaneously with forming isolation trenches having substantially the same depth as the alignment trenches.

10 Claims, 6 Drawing Sheets

METHOD FOR MAKING SHALLOW TRENCH MARKS

TECHNICAL FIELD

The present invention relates to a method of manufacturing a semiconductor device comprising trench isolation. The invention has particular applicability in manufacturing very large scale integration and high density semiconductor devices having a plurality of photolithographically printed circuit patterns.

BACKGROUND ART

The escalating requirements for high densification and performance associated with ultra large scale integration semiconductor devices requires minimal design features less than $0.30\mu$, e.g., $0.25\mu$ and under, increased transistor and circuit speeds, high reliability and increase manufacturing throughput for competitiveness. The reduction of design features to $0.25\mu$ and under generates acute problems challenging the limitations of conventional semiconductor manufacturing technology, particularly for increased manufacturing throughput and cost reduction.

Conventional semiconductor manufacturing methodology comprises numerous processing steps, including photolithographically printing and transferring a plurality of integrated circuit patterns on a wafer or die surface on a plurality of metal layers spaced apart by dielectric interlayers and connected by vias. The proper functioning of the final semiconductor device depends upon precise alignment of the various circuit patterns and layers formed thereon. Misalignment of a single pattern or layer can prove catastrophic to circuit functionality.

Conventional semiconductor manufacturing methodology comprises photolithographically printing circuit patterns in device forming areas on layers utilizing photoresist masks having openings therein which define the various patterns. A typical photolithographic technique is commonly referred to as a step-and-repeat pattern transfer system ("stepper") involving imaging of several exposures of portions of the wafer to cover an entire wafer surface. During photolithographic printing, alignment is ensured by reference to alignment marks formed on the wafer surface outside the device forming area on which the circuits are printed.

To achieve the requisite high degree of precision required for aligning the various layers and printed circuits, alignment marks are conventionally etched in the wafer surface so that, in each photolithographic step, the mask is properly aligned according to the alignment marks before exposing the wafer. Typically, four alignment marks are provided, circumferentially positioned about the periphery of the wafer, although alignment can be achieved with fewer or greater than four alignment marks and can be positioned at any convenient location.

Alignment marks must be sharply defined and extend to only a shallow depth into the wafer surface to obtain the requisite alignment signal strength for proper recognition by the stepper. A typical depth of an alignment mark required by conventional steppers manufactured by ASM Lithography is $1,200Å$. Alignment marks for steppers marketed by other manufacturers may require slightly different depths. Alignment is particularly critical in manufacturing semiconductor devices having submicron design features of less than $0.30Å$, such as $0.25Å$ and under.

The formation of sharply defined alignment marks disadvantageously requires several processing steps typically performed before formation of active components in the device forming area. Conventional methodology for forming alignment marks comprises cleaning a substrate surface, growing or depositing a silicon oxide layer thereon, depositing a photoresist material on the silicon oxide layer and subsequently patterning the photoresist material by a photolithographic technique to form a mask having an opening for an alignment mark. The alignment mark is then transferred to the substrate by anisotropic etching, and is conventionally referred to as the zero layer etch. Typical anisotropic etching comprises reactive ion etching (RIE) to form substantially orthogonal sidewalls substantially perpendicular to the substrate plane. The photoresist mask is then removed leaving an alignment mark having a depth of about $1,200Å$ in the substrate. The oxide layer is then removed leaving the alignment mark for use in photolithographic processing to align subsequently formed photoresist masks in forming various elements, integrated circuitry and interconnect patterns.

Subsequent to forming the alignment marks, conventional practices comprise isolating an active region, as by trench isolation. A trench isolation methodology typically comprises forming a pad oxide layer on a substrate surface and a nitride layer thereon. A photoresist mask is formed on the nitride layer and anisotropic etching is conducted to form a trench in the substrate. Thermal oxidation is then performed to grow an oxide liner on the trench walls to control the silicon-silicon dioxide interface quality. The trench is then refilled with an insulating material, such as silicon dioxide derived from tetraethyl orthosilicate (TEOS). The surface is then planarized, as by chemical-mechanical polishing (CMP).

In copending application Ser. No. 08/789,255 filed on Jan. 28, 1997, methodology is disclosed for providing alignment marks free from nitride residue by etching the alignment marks to an ultimate depth of about $1,200Å$ subsequent to deposition of a nitride layer and before shallow trench isolation formation, to ensure precise alignment of a mask during subsequent processing of the semiconductor die wafer. Such methodology constitutes an improvement over conventional practices; however, the formation of an alignment mark requires separate manipulative steps.

There exists a need for semiconductor manufacturing methodology with a reduced number of processing steps, thereby increasing production throughput and reducing costs. There exists a particular need for improving the efficiency of semiconductor manufacturing technology in forming high density devices having minimal dimensions.

DISCLOSURE OF THE INVENTION

An object of the present invention is a method of manufacturing a semiconductor device having alignment marks with increased efficiency.

Another object of the present invention is a semiconductor device containing integrated circuitry formed by photolithographic techniques using an alignment mark.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, which method comprises:

providing a mask on a main surface of a semiconductor substrate or an epitaxial layer formed on the semiconductor substrate, which mask contains: a first opening for forming a first trench in an area of the main surface outside of a device forming area; a second opening for forming a second trench surrounding an active region in the device forming area; and etching the main surface through the openings in the mask to substantially simultaneously form the: first trench, constituting an alignment mark, in the area outside of the device forming area; and second trench for isolating an active region in the device forming area.

Another aspect of the present invention is a semiconductor wafer having a device forming area on a surface thereof on which a circuit pattern is formed by a photolithographic technique utilizing an alignment mark on the semiconductor wafer outside of the device forming area, wherein the alignment mark comprises a trench extending into the wafer surface to a depth of about 2,400Å to less than about 4,000Å.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
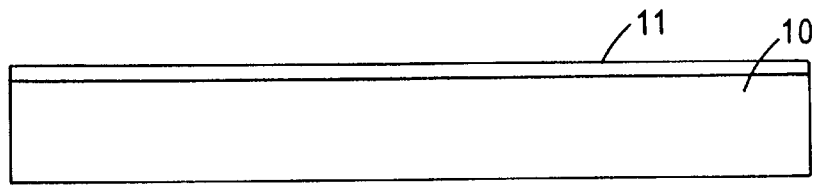
FIGS. 1 through 12 represent sequential phases of a method in accordance with an embodiment of the present invention.

Conventional methodology in manufacturing semiconductor devices comprises forming alignment marks in an area of the substrate surface outside of the device forming area prior to fabricating the active components in the device forming area. Alignment marks must be sharply defined and shallow to provide the requisite alignment signal strength for proper recognition by the stepper during photolithographic processing. A conventional depth to which an alignment mark is etched into a substrate is about 1,200Å. The requirement to provide alignment marks prior to initiating fabrication of the active components in the device forming area disadvantageously requires several processing steps, including separate photolithographic and steps, which undesirably decrease production throughput.

Conventional practices also comprise forming isolation trenches in the device forming area of the substrate surface for isolating an active region subsequent to forming alignment marks. As miniaturization increases, the depth to which isolation trenches are etched in the substrate decreases accordingly. In forming semiconductor devices having a design rule of about 0.25Å and under, isolation trenches are etched in a substrate to a depth of about 2,400Å to about less than about 4,000Å, e.g., about 3,000Å. The present invention stems from the discovery that a trench having dimensions substantially the same as the dimensions of an isolation trench formed in fabricating devices having a design rule of about 0.30$\mu$ and under, e.g., about 0.25$\mu$ and under, can be employed effectively as an alignment mark for photolithographic processing, notwithstanding a depth considerably deeper than 1,200Å. Isolation trenches having a depth of about 2,400Å to less than about 4,000Å, e.g., about 3,000Å, generate a signal strength which is weaker than a separately formed alignment mark having a depth of about 1,200Å. However, it was discovered that the signal generated by such relatively deep trenches is sufficiently strong to provide proper recognition by the stepper in order to effectively function as an alignment mark enabling precise alignment.

Accordingly, the present invention comprises the elimination of the processing steps required to form separate alignment marks prior to initiating fabrication of the active components in the device forming area. The elimination of such processing steps significantly increases throughput and provides economic advantages. In accordance with the present invention, a mask containing openings for isolation trenches is formed on a semiconductor substrate; however, the mask also contains openings outside of the device forming area for forming trenches which function as alignment marks. Such alignment marks are typically wider than the isolation trenches, e.g., about 10$\mu$ to about 20$\mu$ in width.

The present invention, therefore, eliminates processing steps required for forming separate alignment marks prior to commencing fabrication of the active elements in the device forming area. The elimination of such processing steps, particularly the photolithographic step and zero layer etch, significantly increases throughput and provides an economic advantage.

In accordance with an embodiment of the present invention, a pad oxide layer, typically silicon dioxide, is grown or deposited on a substrate surface, and a nitride layer, such as silicon nitride, deposited thereon. As employed throughout this disclosure, the term "substrate" denotes a semiconductor substrate, an epitaxial layer grown thereon or a well region formed therein.

A mask, such as a photoresist mask, is formed on the silicon nitride layer. The mask contains a number of openings in the device forming area through which trenches are etched in the underlying substrate which serve as isolating insulating trenches to surround an active region. In addition, the mask contains openings to form alignment trenches in areas of the substrate surface outside of the device forming area, which openings are typically wider than the openings for the isolation trenches. Etching is then conducted to form trenches in the device forming area substantially simultaneously with trenches in the substrate surface outside of the device forming area. The trenches in the device forming area and outside of the device forming area are substantially simultaneously formed, typically have different widths but are etched to substantially the same depth, i.e., up to about 4,000Å, e.g., about 2,400Å to about 3,000Å.

The trenches formed within the device forming area serve as isolation trenches for isolating an active region, while the trenches formed outside of the device forming area serve as alignment marks for subsequent photolithographic processing. After formation of the trenches in the device forming area and outside of the device forming area, processing proceeds in accordance with conventional methodology. For example, the mask is removed, an oxide liner grown in the trenches, the trenches filled with insulating material and the substrate surface polished, as by CMP. An active region surrounded by the insulating isolation trench is then prepared in a conventional manner as by forming a gate electrode on the substrate surface with a gate oxide layer therebetween. Ion implantation is then typically conducted to form source/drain regions.

Subsequently, dielectric interlayers and metal layers are sequentially applied with photolithographical processing to form integrated circuitry and interconnection patterns. During such photolithographic processing, the alignment trenches (marks) are employed to ensure proper registration and alignment of various circuit patterns and layers. It was unexpectedly found that trenches having a depth substantially the same as the trenches for isolating an active region can effectively function as alignment marks and provide the requisite signal strength for proper recognition of the stepper during photolithographic processing.

Figure 2:
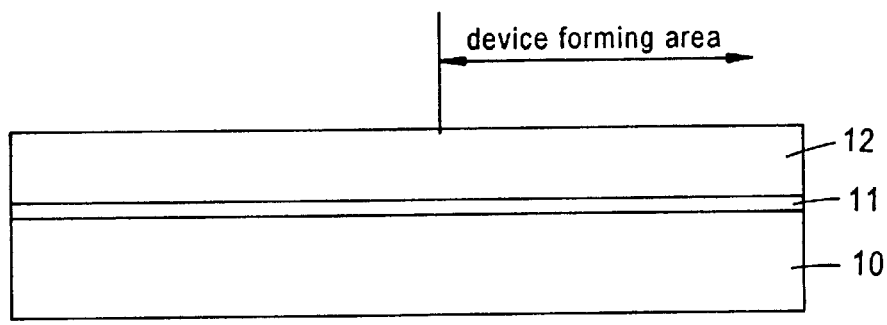
Figure 3:
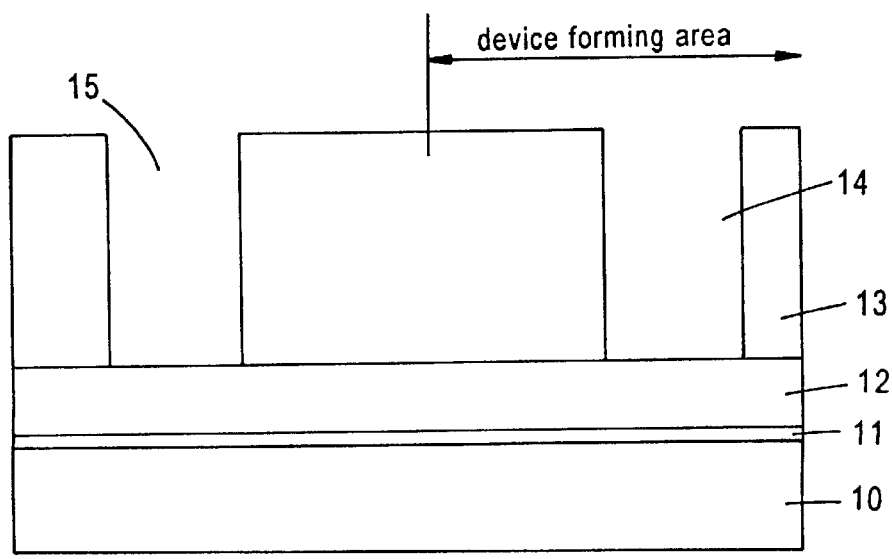

An embodiment of a method in accordance with the present invention is illustrated in FIGS. 1 through 12, wherein similar features are denoted with similar reference numerals. Adverting to FIG. 1, pad oxide layer 11, such as silicon dioxide, is formed on substrate 10. Subsequently, as shown in FIG. 2, nitride layer 12 is formed on pad oxide layer 11. The thickness of pad oxide layer and nitride layer conform with conventional shallow trench isolation practices. For example, a pad oxide layer is typically formed at a thickness of about 150Å, while a silicon nitride layer 12 is typically formed at a thickness of about 1,700Å and functions as a polish stop layer during subsequent CMP. The right hand portion of the substrate surface is designated as the device forming area, as illustrated in FIGS. 2 and 3; however, for convenience, such designation does not appear on the other figures. Thus, the device forming area in the right hand portion of each figure ultimately comprises insulation trenches for isolating an active region, while the left hand portion of each figure outside of the device forming area ultimately contains trenches which function as alignment marks during subsequent photolithographic processing.

Adverting to FIG. 3, photoresist mask 13 is formed on nitride layer 12. Photoresist mask 13 contains openings 14 and 15. Opening 14 is positioned above the device forming area, while opening 15 is positioned above the area outside of the device forming area and typically has a width greater than that of opening 14.

Figure 4:
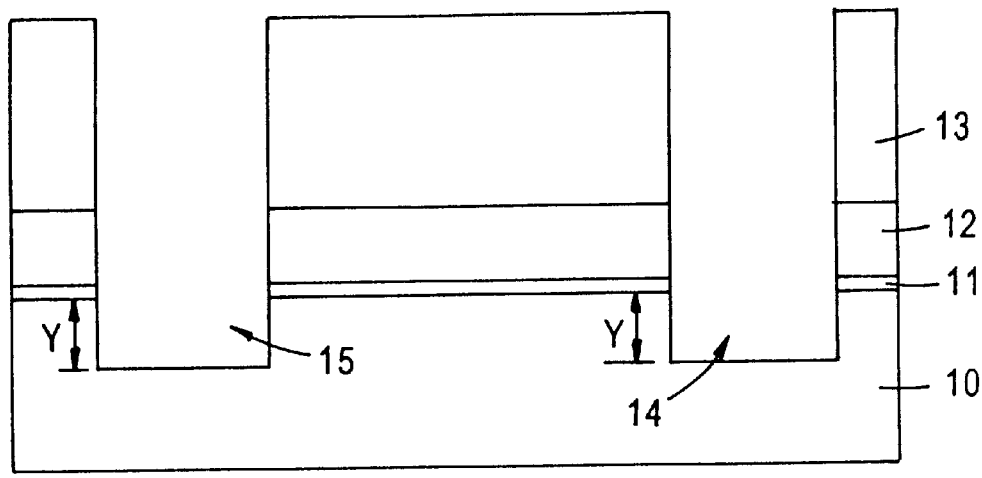

Adverting to FIG. 4, anisotropic etching is then conducted, such as RIE, through silicon nitride layer 12, silicon oxide pad layer 11 and underlying substrate to form trenches having an internal surface with side surfaces substantially vertically aligned with the side surfaces of silicon oxide pad layer 11 and silicon nitride layer 12. Thus, anisotropic etching results in orthogonal sidewalls, i.e., sidewalls normal to the plane of the substrate surface prior to etching and normal to the bottom of the trench opening. Trench 14 is formed in the device forming area to serve as an insulating trench for isolating an active region, while trench 15 is formed outside of the device forming area and to function as an alignment mark during subsequent photolithographic processing. Isolating trench 14 and alignment trench 15 are formed to a depth Y in the substrate such that, upon subsequent formation of the oxide liner, the overall depth into the substrate is about 2,400Å to less than about 4,000Å, e.g., about 3,000Å. For example, in targeting a depth of about 3,000Å, trenches 14 and 15 are formed to a depth Y of about 2,775Å to allow for subsequent consumption of substrate material during thermal oxidation to form an oxide liner in the trenches.

Figure 5:
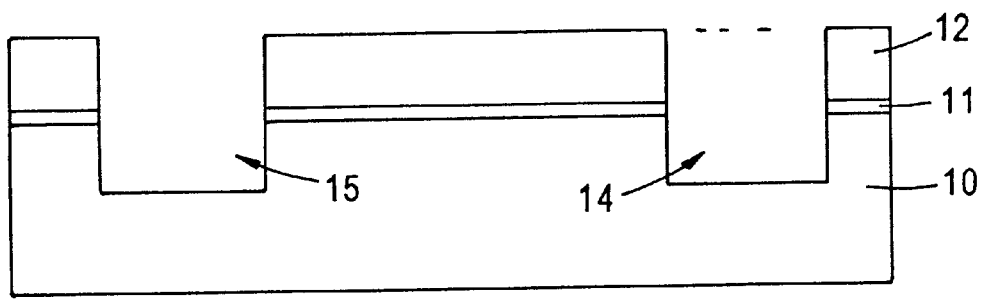
Figure 6:
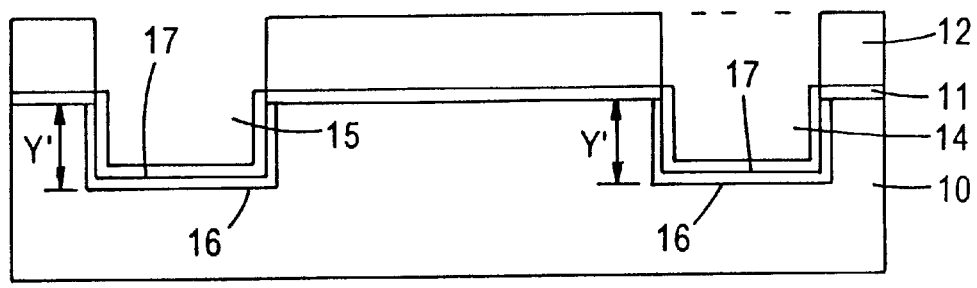

Subsequent to formation of trenches 14 and 15, the mask layer 13 is removed, as shown in FIG. 5. The trenches are then cleaned employing a conventional "RCA" clean, typically performed with a mixture of hydrogen peroxide and ammonium hydroxide, to remove residues. Subsequent to cleaning, an oxide liner 16 is formed, as shown in FIG. 6, typically by thermal oxidation at a temperature in excess of about 1,000° C. Oxide liner 16 is typically grown to a thickness of about 500Å, approximately 45% of which grows into substrate 10, thereby extending the depth of trenches 14 and 15 into substrate 10 to Y', e.g., about 3,000Å. Reference numeral 17 denotes the original trench profile for trenches 14 and 15 prior to thermal oxidation to form oxide liner 16.

Figure 7:
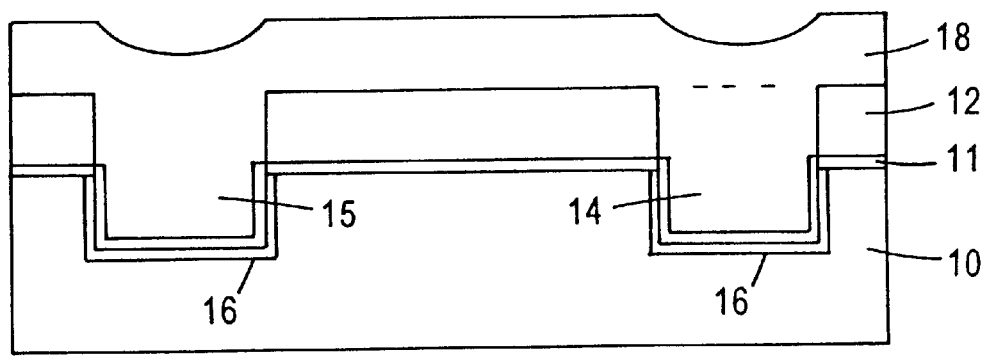

Adverting to FIG. 7, a conformal layer of silicon dioxide 18 is deposited, e.g., TEOS by low pressure chemical vapor deposition, filling trenches 14 and 15. Oxide liner 16 and silicon dioxide 18 are relatively transparent to the stepper or other alignment-recognition devices. Silicon dioxide layer 18 is typically deposited over the entire substrate at a thickness of about 6,200Å.

Figure 8:
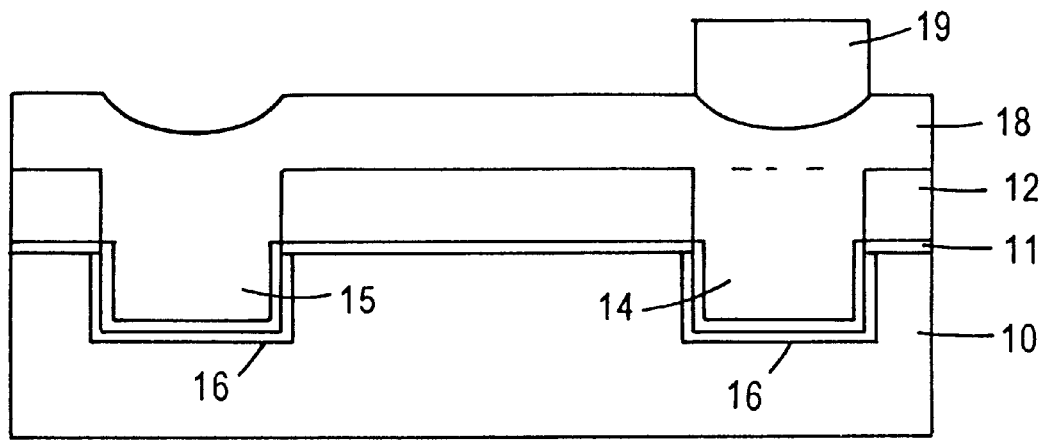
Figure 9:
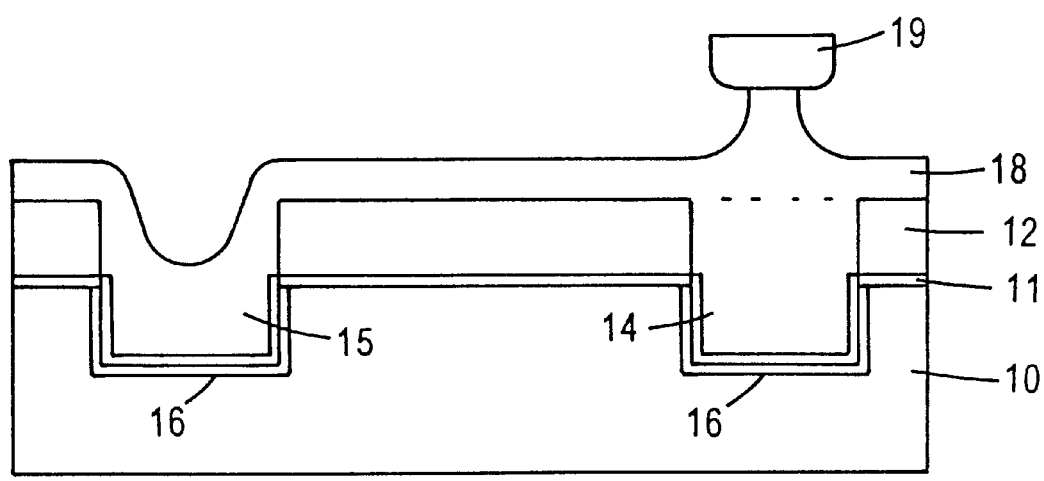

Adverting to FIG. 8, planarization mask 19 is then applied on silicon dioxide layer 18. Planarization mask 19 is a reverse of the active mask to open areas on nitride layer 34 and exposes alignment trench 15. Isotropic etching is then performed to remove high areas of silicon dioxide layer 18 through mask 19, as shown in FIG. 9. The exposed portions of silicon dioxide layer 18 are then etched down to the level of the unexposed portions thereof, as by wet etching employing a buffered oxide etch comprising an aqueous solution of 40 parts ammonium fluoride and 1 part hydrofluoric acid, or by a dry isotropic etch performed in a RIE system. Isotropic etching undercuts the photoresist mask portions 19 leaving less oxide in the raised portions adjacent the edges of mask 19, thereby simplifying subsequent removal of the raised portions.

Figure 10:
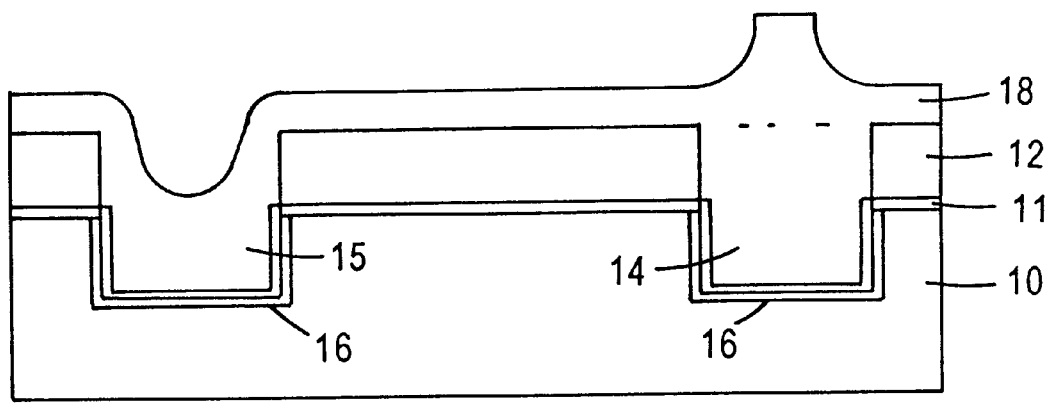

Subsequent to etching, mask 19 is removed, as shown in FIG. 10. CMP is then performed to provide global planarization. During CMP, any TEOS derived silicon dioxide remaining on nitride layer 12 is removed, nitride layer 12 functioning as a polish stop layer during CMP. As CMP planarization is relatively imprecise, any polishing of substrate 10 would result in undesirable damage thereto.

Figure 11:
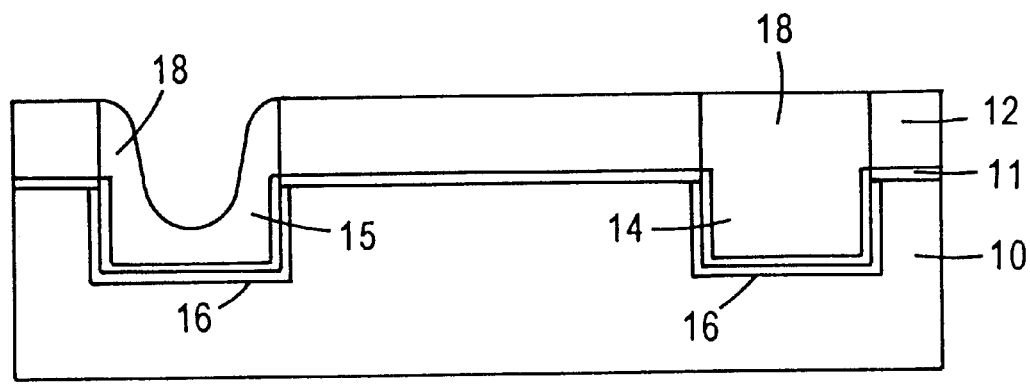
Figure 12:
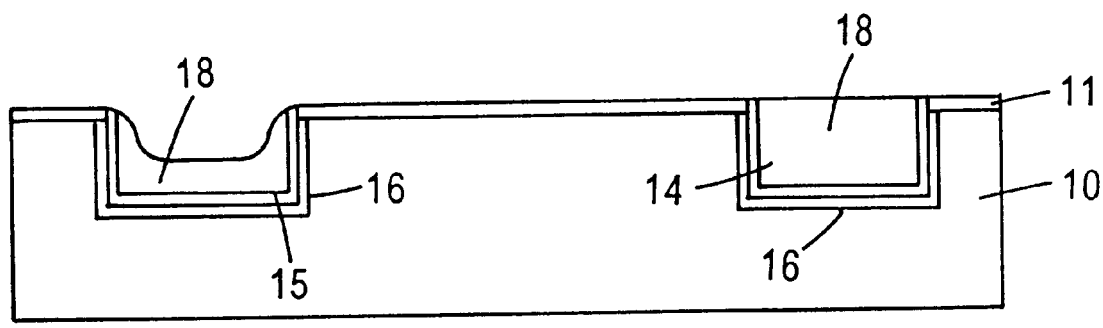

FIG. 11 illustrates the wafer structure subsequent to CMP. Silicon dioxide fills trench 14 and extends substantially coplanar with nitride layer 12, while silicon dioxide 18 does not completely fill trench 15 as the area of the wafer outside of the device forming area was not protected by mask 19 during etching. Subsequent to CMP, nitride layer 12 is removed, as by employing hot phosphoric acid, resulting in the structure depicted in FIG. 23.

The present invention achieves the objectives of copending application Ser. No. 08/789,255 in that alignment trench 15 is free of nitride residues. The trench liner 16 and silicon dioxide layer 18 are relatively transparent, thereby enabling the use of trench 15 as an alignment mark during the subsequent photolithographic processing. Thus, the present invention enables precise alignment during photolithographic processing employing a trench having dimensions substantially the same as isolation trenches for isolating active regions of a semiconductor device. The present invention advantageously eliminates processing steps attendant upon forming separate alignment marks prior to initiating formation of active elements in the device forming area, including the costly photolithographic processing and zero level etch steps. Thus, the present invention significantly enhances production throughput with reduced costs.

The present invention can be practiced employing conventional materials, methodology and equipment. Accordingly, the details of such materials, equipment and methodology are not set forth herein in detail. The present invention is applicable to production of various types of semiconductor devices, and enjoys particular utility in the production of semiconductor device having a design rule less than about 0.30μ, including less than about 0.25μ.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:
    providing a mask on a main surface of a semiconductor substrate or an epitaxial layer formed on the semiconductor substrate, which mask contains:
        a first opening for forming a first trench in an area of the main surface outside of a device forming area;
        a second opening for forming a second trench surrounding an active region in the device forming area; and
    etching the main surface through the openings in the mask to substantially simultaneously form the:
        first trench, constituting an alignment mark, in the area outside the device forming area; and
        second trench for isolating an active region in the device forming area.

2. The method according to claim 1, wherein the first trench has a width greater than the width of the second trench.

3. The method according to claim 2, wherein the first and second trenches extend into the main surface to a depth of up to about 4,000Å.

4. The method according to claim 3, wherein the first and second trenches extend into the main surface to a depth of about 2,400Å to about 3,000Å.

5. The method according to claim 3, wherein the first trench has a width greater than about 10μ and the second trench has a width less than about 0.30μ.

6. The method according to claim 5, wherein the second trench has a width less than about 0.25μ.

7. The method according to claim 1, comprising photolithographically printing a circuit pattern on the device forming area utilizing the first trench as an alignment mark.

8. The method according to claim 1, further comprising:
    forming a pad silicon oxide layer on the main surface;
    forming a silicon nitride layer on the pad silicon oxide layer;
    providing the mask on the silicon nitride layer, which mask comprises a resist mask; and
    anisotropically etching to remove portions of the underlying silicon nitride and pad silicon oxide layers and to form the first and second trenches in the substrate.

9. The method according to claim 8, further comprising sequentially:
    thermally growing a silicon oxide liner in the first and second trenches;
    filing the first and second trenches with an insulating material comprising silicon dioxide derived from tetraethyl orthosilicate by low pressure chemical vapor deposition, silicon dioxide derived from silane by low pressure chemical vapor deposition or a high density plasma oxide; and
    polishing the main surface by chemical-mechanical polishing.

10. The method according to claim 9, comprising photolithographically printing a circuit pattern on the device forming area utilizing the first trench as an alignment mask.

* * * * *